(12) United States Patent
Su

(10) Patent No.: US 12,108,521 B2
(45) Date of Patent: Oct. 1, 2024

(54) CIRCUIT BOARD AND ELECTRONIC DEVICE

(71) Applicant: GUANGZHOU FANGBANG ELECTRONICS CO., LTD, Guangdong (CN)

(72) Inventor: Zhi Su, Guangdong (CN)

(73) Assignee: GUANGZHOU FANGBANG ELECTRONICS CO., LTD, Guangdong (CN)

( * ) Notice: Subject to any disclaimer, the term of this patent is extended or adjusted under 35 U.S.C. 154(b) by 0 days.

(21) Appl. No.: 17/642,024

(22) PCT Filed: Dec. 17, 2019

(86) PCT No.: PCT/CN2019/125927
§ 371 (c)(1),
(2) Date: Mar. 10, 2022

(87) PCT Pub. No.: WO2021/047093
PCT Pub. Date: Mar. 18, 2021

(65) Prior Publication Data
US 2024/0049381 A1    Feb. 8, 2024

(30) Foreign Application Priority Data

Sep. 12, 2019  (CN) .................. 201910867306.X

(51) Int. Cl.
*H05K 1/02* (2006.01)
(52) U.S. Cl.
CPC .......... *H05K 1/0218* (2013.01); *H05K 1/024* (2013.01); *H05K 2201/0154* (2013.01)

(58) Field of Classification Search
None
See application file for complete search history.

(56) References Cited

U.S. PATENT DOCUMENTS 5,233,133 A * 8/1993 Iwasaki .................. H05K 3/429
174/250
2015/0201535 A1    7/2015 Su

FOREIGN PATENT DOCUMENTS

| CN | 203492325 U | * | 3/2014 | .......... H05K 1/0218 |
|----|-------------|---|--------|----------------------|
| CN | 105848409 A |   | 8/2016 |                      |
| CN | 208425127 U |   | 1/2019 |                      |
| CN | 208708070 U |   | 4/2019 |                      |
| JP | 247607      |   | 3/1990 |                      |
| JP | 8125380     |   | 5/1996 |                      |
| JP | 2011159879  |   | 8/2011 |                      |

OTHER PUBLICATIONS

CN 203492325 U (Translation) (Year: 2024).*

* cited by examiner

*Primary Examiner* — Hoa C Nguyen
*Assistant Examiner* — John B Freal
(74) *Attorney, Agent, or Firm* — Riverside Law LLP

(57) ABSTRACT

A circuit board and an electronic device are provided. The circuit board includes a circuit board body (10) and a shielding film layer (11), and further includes a dielectric layer (12), where the dielectric layer (12) is arranged between the circuit board body (10) and the shielding film layer (11).

19 Claims, 2 Drawing Sheets

CIRCUIT BOARD AND ELECTRONIC DEVICE

CROSS-REFERENCE TO RELATED APPLICATIONS

The disclosure is a national stage application of International Patent Application No. PCT/CN2019/125927, which is filed on Dec. 17, 2019, and claims the priority of Chinese Patent Application No. 201910867306.X filed to the Chinese Patent Office on Sep. 12, 2019, which is incorporated in its entirety herein by reference

TECHNICAL FIELD

The disclosure relates to a technical field of electrons, and for example, relates to a circuit board and an electronic device.

BACKGROUND

In recent years, with constant growth of the electronic technology and the integrated circuit technology, the transmission of high-frequency signals has posed higher requirements for circuit boards. However, traditional circuit boards generally have the defect of excessive transmission loss (insertion loss). Therefore, the traditional circuit boards no longer meet the use requirements, and it is urgent to improve the traditional circuit boards.

SUMMARY

The disclosure provides a circuit board and an electronic device, so as to achieve the technical effects that the circuit board has relatively low insertion loss and desirable signal transmission integrity when transmitting a high-frequency signal and is simple in manufacturing process and relatively low in manufacturing cost.

An embodiment of the disclosure provides a circuit board. The circuit board includes a circuit board body and a shielding film layer, and further includes a dielectric layer, where the dielectric layer is arranged between the circuit board body and the shielding film layer.

In one embodiment, the dielectric layer has a relative dielectric constant in a range of 1 to 10.

In one embodiment, the dielectric layer has a relative dielectric constant in a range of 2 to 6.

In one embodiment, the dielectric layer is made of at least one of the following: epoxy resin, modified epoxy resin, polyimide, modified polyimide, thermoplastic polyimide, modified thermoplastic polyimide, polyphenylene ether, acrylic acid, modified acrylic acid, olefin resin, polyetheretherketone, polystyrene, polyester, rubber, modified rubber, polyurethane and liquid crystal polymer.

In one embodiment, the dielectric layer has a thickness in a range of 1 micron to 100 microns.

In one embodiment, the dielectric layer has a thickness in a range of 1 micron to 50 microns.

In one embodiment, the circuit board body includes a substrate layer, a wiring layer arranged on at least one side of the substrate layer and a covering film layer arranged on a side, away from the substrate layer, of the wiring layer, wherein the wiring layer includes a plurality of transmission wires, each of the transmission wires including a signal wire and a grounding wire; and the dielectric layer is arranged on a side, away from the substrate layer, of the covering film layer.

In one embodiment, the covering film layer includes a covering layer and a first adhesive film layer, wherein the covering layer is attached to a surface of a side, away from the substrate layer, of the wiring layer by the first adhesive film layer, the dielectric layer is arranged between the covering layer and the shielding film layer, and the covering layer and the dielectric layer are of an integrated structure.

In one embodiment, the covering layer and the dielectric layer are made of different materials.

In one embodiment, the shielding film layer includes a second adhesive film layer, a shielding layer and an insulating layer which are sequentially stacked. The shielding film layer is attached to a surface of a side, away from the circuit board body, of the dielectric layer by the second adhesive film layer. A protruding structure is arranged on a side, close to the second adhesive film layer, of the shielding layer and extends into the second adhesive film layer.

In one embodiment, the second adhesive film layer is made of a conductive adhesive.

In one embodiment, the shielding film layer includes a conductive adhesive layer, a shielding layer and an insulating layer which are sequentially stacked, and the shielding film layer is attached to a surface of a side, away from the dielectric layer, of the circuit board body by the conductive adhesive layer.

In one embodiment, the shielding layer is provided with at least one through hole.

In one embodiment, the shielding layer is electrically connected with the grounding wire of the circuit board body by a connecting hole.

The embodiment of the disclosure further provides an electronic device. The electronic device includes any one of the circuit board in the above embodiments.

The disclosure discloses the circuit board and the electronic device. The circuit board includes the circuit board body and the shielding film layer, and further includes the dielectric layer, wherein the dielectric layer is arranged between the circuit board body and the shielding film layer. By arranging the dielectric layer between the circuit board body and the shielding film layer of the circuit board, when the circuit board transmits the high-frequency signal, an attenuation degree of the signal is reduced, so as to reduce insertion loss of the circuit board, and achieve the technical effects that the circuit board has relatively low insertion loss and desirable signal transmission integrity when transmitting the high-frequency signals and is simple in manufacturing process and relatively low in manufacturing cost.

DETAILED DESCRIPTION OF THE EMBODIMENTS

The disclosure will be described in detail below with reference to the accompanying drawings and the embodiments. It can be understood that the embodiments described herein are merely used to explain the disclosure, rather than limit the disclosure. In addition, it should be noted that, for the convenience of description, some rather than all of structures related to the disclosure are merely shown in the accompanying drawings.

It should be noted that the terms "first", "second" and so forth, in the description and claims of the disclosure and in the accompanying drawings, are used to distinguish different objects and not used to limit a particular order. The embodiments of the disclosure described below may be implemented individually or in combination with each other, and the embodiments of the disclosure are not limited thereto.

Embodiment 1

Figure 1:
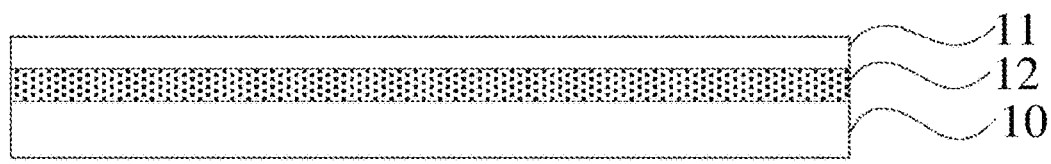
FIG. 1 is a structural schematic diagram of a circuit board provided in an embodiment of the disclosure.

FIG. 1 is a structural schematic diagram of a circuit board provided in an embodiment of the disclosure.

As shown in FIG. 1, the circuit board provided in the embodiment of the disclosure includes a circuit board body 10 and a shielding film layer 11, and further includes a dielectric layer 12, wherein the dielectric layer 12 is arranged between the circuit board body 10 and the shielding film layer 11.

In one embodiment, as shown in FIG. 1, the circuit board includes the circuit board body 10, the dielectric layer 12 and the shielding film layer 11. The dielectric layer 12 and the shielding film layer 11 are sequentially stacked on a front surface or a back surface of the circuit board body 10, or may be sequentially stacked on the front surface and the back surface of the circuit board body 10 simultaneously. Accordingly, no matter the circuit board is a single-face board, a double-face board, a multi-layer board or a rigid-flex board, the dielectric layer 12 may be attached to the circuit board body 10 according to actual needs. Experiments show that by arranging the dielectric layer 12 between the circuit board body 10 and the shielding film layer 11, insertion loss of the circuit board may be effectively reduced.

Figure 2:
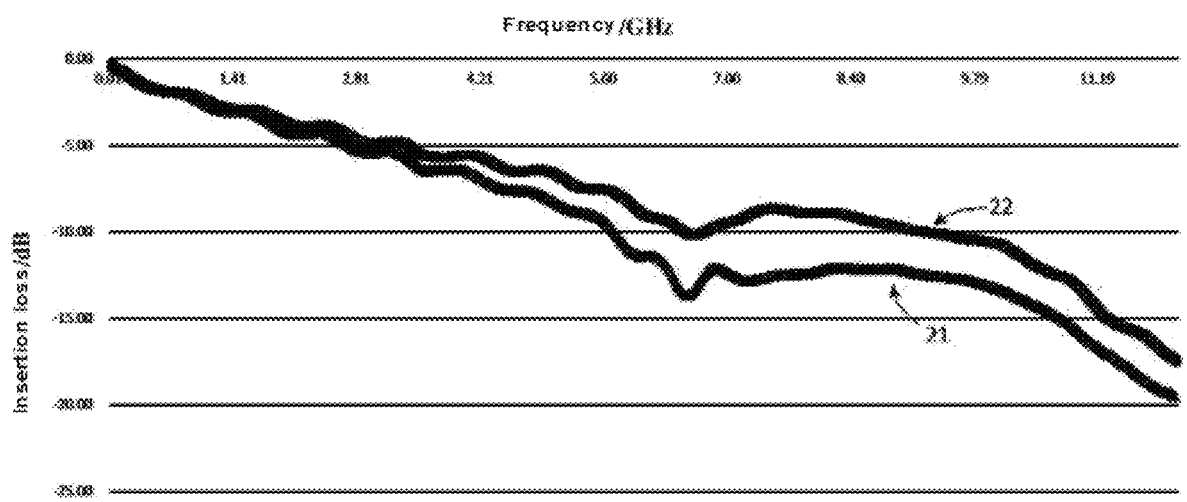
FIG. 2 is a broken line graph of comparison of insertion loss of the circuit board before and after a dielectric layer is added as provided in an embodiment of the disclosure.

FIG. 2 is a broken line graph of comparison of insertion loss of the circuit board before and after the dielectric layer is added as provided in an embodiment of the disclosure.

As shown in FIG. 2, a broken line 21 is an insertion loss graph of the circuit board before the dielectric layer 12 is added, and a broken line 22 is an insertion loss graph of the circuit board after the dielectric layer 12 is added. By comparing the two broken lines in FIG. 2, it may be clearly seen that the insertion loss of the circuit board is effectively reduced after the dielectric layer 12 is added.

In the embodiment of the disclosure, by arranging the dielectric layer between the circuit board body and the shielding film layer of the circuit board, when the circuit board transmits a high-frequency signal, an attenuation degree of the signal is reduced, so as to reduce the insertion loss of the circuit board, and achieve the technical effects that the circuit board has relatively low insertion loss and desirable signal transmission integrity when transmitting the high-frequency signal, and the circuit board is simple in manufacturing process and relatively low in manufacturing cost.

In one embodiment, the dielectric layer 12 has a relative dielectric constant in a range of 1 to 10.

For example, the dielectric layer 12 has a relative dielectric constant in a range of 2 to 6.

In one embodiment, in order to effectively reduce the insertion loss of the circuit board, the dielectric layer 12 has a relative dielectric constant in a range of 1 to 10 in the disclosure. On this basis, if the dielectric layer 12 has a relative dielectric constant in a range of 2 to 6, it is more effective to reduce the insertion loss of the circuit board. Obviously, the dielectric layers 12 made of different materials have different relative dielectric constant ranges. Through experiments, it is proved that by selecting the material having the relative dielectric constant in a range of 2-6 to make the dielectric layer 12, the insertion loss of the circuit board may be better reduced. When the circuit board is actually manufactured, the dielectric layers 12 with different relative dielectric constants may be selected to be arranged between the circuit board body 10 and the shielding film layer 11 according to needs.

In one embodiment, the dielectric layer 12 is made of at least one of the following: epoxy resin, modified epoxy resin, polyimide, modified polyimide, thermoplastic polyimide, modified thermoplastic polyimide, polyphenylene ether, acrylic acid, modified acrylic acid, olefin resin, polyetheretherketone, polystyrene, polyester, rubber, modified rubber, polyurethane and liquid crystal polymer.

In one embodiment, the dielectric layer 12 may be made of a single material, or may be made by mixing a plurality of materials. Obviously, the dielectric layers 12 made of different materials have different relative dielectric constants, and may be selected according to the needs when the circuit board is actually manufactured.

In one embodiment, the dielectric layer has a thickness in a range of 1 micron to 100 microns.

For example, the dielectric layer has a thickness in a range of 1 micron to 50 microns.

In one embodiment, arranging the dielectric layers 12 with different thicknesses have different effects on reducing the insertion loss of the circuit board. Within a certain range, the thicker the dielectric layer 12 is, the lower the insertion loss of the circuit board is. Conversely, the thinner the dielectric layer 12 is, the less the insertion loss of the corresponding circuit board is reduced. Through experimental verification, the dielectric layer 12 may have the thickness in a range of 1 micron to 100 microns. Within this thickness range, the insertion loss of the circuit board may be reduced, and the overall thickness of the circuit board may be controlled within an optimal range. For example, the dielectric layer 12 may have the thickness in a range of 1 micron to 50 microns, within this thickness range, the dielectric layer 12 may better reduce the insertion loss of the circuit board. Table 1 shows a relation between the thickness of the dielectric layer and an average reduction value of the insertion loss of the circuit board obtained by experiments. Data in Table 1 is obtained by experiments in a frequency in a range of 14 to 12 GHz.

TABLE 1

Relation table of thickness of dielectric layer and
reduction value (average value) of insertion loss

| Thickness of dielectric layer/micron | Reduction value (average value) of insertion loss/dB |
|---|---|
| 0.5 | 0.1 |
| 5 | 0.15 |
| 7 | 0.2 |
| 10 | 0.22 |
| 20 | 0.3 |
| 50 | 0.4 |
| 100 | 0.5 |

Figure 3:
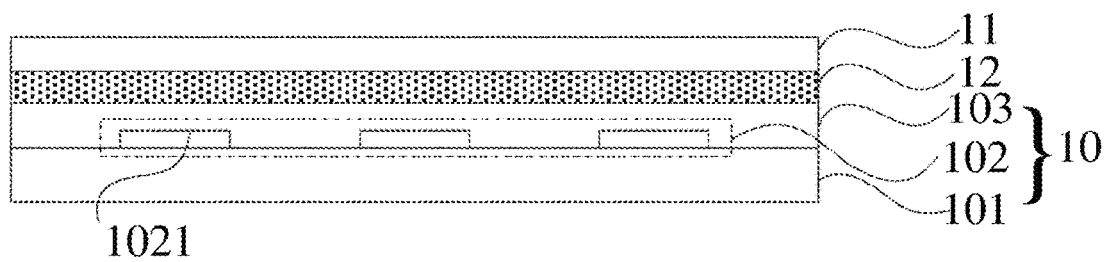
FIG. 3 is a structural schematic diagram of a circuit board body of the circuit board provided in an embodiment of the disclosure.

FIG. 3 is a structural schematic diagram of the circuit board body of the circuit board provided in an embodiment of the disclosure.

In one embodiment, as shown in FIG. 3, the circuit board body 10 includes a substrate layer 101, a wiring layer 102 arranged on at least one side of the substrate layer 101 and a covering film layer 103 arranged on one side, away from the substrate layer 101, of the wiring layer 102, wherein the wiring layer 102 includes a plurality of transmission wires 1021, each of the transmission wires 1021 including a signal wire and a grounding wire; and the dielectric layer is arranged on one side, away from the substrate layer 101, of the covering film layer 103.

In one embodiment, as shown in FIG. 3, the substrate layer 101 of the circuit board body 10 may be made of PI (polyimide). At least one side of the substrate layer 101 is covered with a copper layer, that is, the copper layer is the above wiring layer 102. The copper layer is etched to form the transmission wires 1021, the transmission wires 1021 including the signal wires and the grounding wires. A covering film layer 103 is arranged on one side, away from the substrate layer 101, of the copper layer, and the dielectric layer 12 is arranged on one side, away from the substrate layer 101, of the covering film layer 103.

Figure 4:
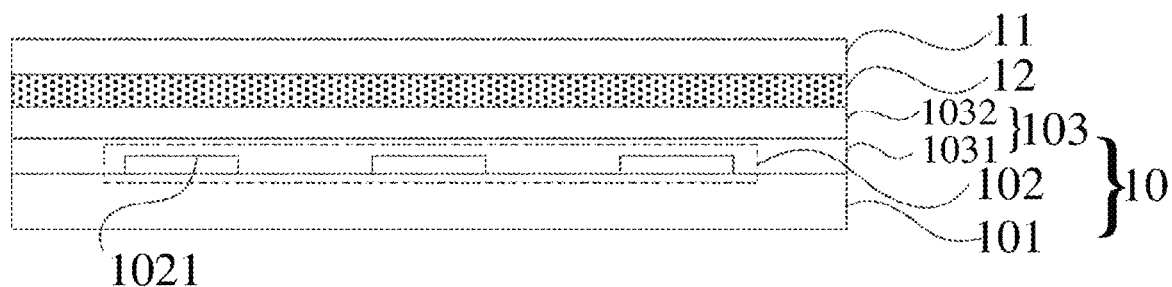
FIG. 4 is a structural diagram of a covering film layer of the circuit board provided in an embodiment of the disclosure.

FIG. 4 is a structural diagram of the covering film layer of the circuit board provided in an embodiment of the disclosure.

In one embodiment, as shown in FIG. 4, the covering film layer 103 includes a covering layer 1032 and a first adhesive film layer 1031, wherein the covering layer 1032 is attached to a surface of one side, away from the substrate layer 101, of the wiring layer 102 by the first adhesive film layer 1031, and the dielectric layer 12 is arranged between the covering layer 1032 and the shielding film layer 11. The covering layer 1032 and the dielectric layer 12 are of an integrated structure.

In one embodiment, the covering layer 1032 and the dielectric layer 12 are made of different materials.

In the embodiment of the disclosure, under the observation of a high-power microscope, the covering film layer 103 actually includes the covering layer 1032 and the first adhesive film layer 1031, wherein the dielectric layer 12 is attached to a surface of one side, away from the first adhesive film layer 1031, of the covering layer 1032, and the covering layer 1032 is usually a PI film, which is used for preventing the transmission wire 1021 on the circuit board from being in contact with the outside to affect transmission of a signal. When the circuit board is manufactured, the covering film layer 103 has a thickness generally in a range of 12 microns to 100 microns, wherein the covering film layer 13 has a common thickness of one of the following: 27.5 microns, 37.5 microns, 50 microns, 70 microns or 80 microns. When the dielectric layer 12 is attached to one side of the covering film layer 103 and the wiring layer 102, the thickness of the covering film layer 103 may be properly adjusted within a thickness range of 12 microns to 100 microns, such that the sum of the thicknesses of the dielectric layer 12 and the covering film layer 103 is still within a conventional thickness range of 12 microns to 100 microns of the covering film layer 103. Through such adjustment, after the dielectric layer 12 is added to the circuit board in the disclosure, the thickness of the circuit board may not be changed, such that insertion loss of the circuit board is reduced, and the thickness of an existing circuit board is not increased. Therefore, the technical effect that the circuit board has relatively low insertion loss and desirable signal transmission integrity when transmitting a high-frequency signal is achieved, and the technical effect that the circuit board is still light and thin under the situation that a stacked structure is added is also achieved.

It should be noted that, under the observation of the high-power microscope, an obvious boundary between the dielectric layer 12 and the covering layer 1032 of the covering film layer 103 does not exist necessarily. In the absence of a boundary between the dielectric layer 12 and the covering layer 1032, the covering layer 1032 and the dielectric layer 12 may be regarded as an integrated structure, that is, the above covering layer 1032 and the dielectric layer 14 are of an integrated structure. Although there is no boundary between the two layers, the covering layer 1032 and the dielectric layer 14 may be made of different layers.

When the circuit board is actually manufactured, the dielectric layer 12 may be arranged between the substrate layer 101 and the covering film layer 103, and the dielectric layer 12 covers surfaces of each of transmission wires 1021. However, such arrangement has the following problems: since the wiring layer 102 includes several transmission wires 1021 arranged at intervals, and the dielectric layer 12 covers the transmission wires 1021 and gaps between the transmission wires 1021, when each of transmission wires 1021 has a different thickness from any other transmission wires 1021, the intervals between the transmission wires 1021 are difference, the dielectric layers 12 covering each of transmission wires 1021 may be prone to have an uneven thickness, thereby affecting high-frequency transmission performance of the circuit board. However, if a circuit board with the dielectric layer 12 having a uniform thickness on each transmission wire 1021 is to be manufactured, a complicated manufacturing process and a high manufacturing cost emerge. Thus, in the disclosure, the dielectric layer 12 is arranged on a surface of one side, away from the substrate layer 101, of the covering film layer 103, when the circuit board is manufactured, the thickness of the dielectric layer 12 may be easily made uniform, and the technical effects that the circuit board is simple in manufacturing process and relatively low in manufacturing cost are achieved.

In addition, when the dielectric layer 12 is arranged between the substrate layer 101 and the covering film layer 103 and covers the surface of each transmission wire 1021, ions of the dielectric layer 12 may migrate to the transmission wire 1021, thereby affecting signal transmission. However, in the disclosure, the dielectric layer is arranged on the surface of one side, away from the substrate layer 101, of the covering film layer 103, such that the ions of the dielectric layer 12 are prevented from migrating to the transmission wire 1021 by isolation of the covering film layer 103, thereby achieving the technical effect that desirable signal transmission integrity is ensured.

Figure 5:
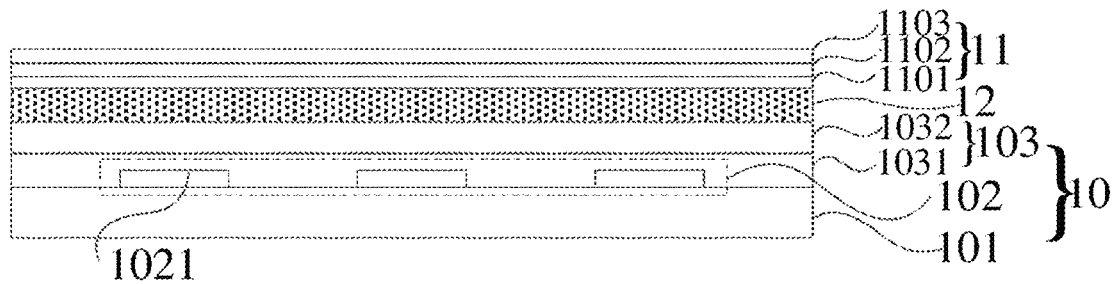
FIG. 5 is a structural diagram of a shielding film layer of the circuit board provided in an embodiment of the disclosure.

FIG. 5 is a structural diagram of a shielding film layer of the circuit board provided in an embodiment of the disclosure.

In one embodiment, as shown in FIG. 5, the shielding film layer 11 includes a second adhesive film layer 1101, a shielding layer 1102 and an insulating layer 1103 which are sequentially stacked. The shielding film layer 11 is attached to a surface of the side, away from the circuit board body 10, of the dielectric layer 12 by the second adhesive film layer 1101. A protruding structure is arranged on one side, close to the second adhesive film layer 1101, of the shielding layer 1102 and extends into the second adhesive film layer 1101.

In one embodiment, the second adhesive film layer 1101 may be made of a conductive adhesive.

In one embodiment, as shown in FIG. 5, the shielding film layer 11 includes a second adhesive film layer 1101 having an attachment function, a shielding layer 1102 attached to one side, away from the dielectric layer 12, of the second adhesive film layer 1101, and an insulating layer 1103 attached to one side, away from the second adhesive film layer 1101, of the shielding layer 1102. Generally, the shielding layer 1102 has a thickness in a range of 0.1 microns to 10 microns, and one side, close to the second adhesive film layer 1101, of the shielding layer 1102 is not a smooth and flat structure, but has protruding structures visible under a microscope (the protruding structures are not shown in FIG. 5), and these protruding structures may extend into the second adhesive film layer 1101. The second adhesive film layer 1101 may be an adhesive film layer with conductive particles, that is, a conductive adhesive.

Figure 6:
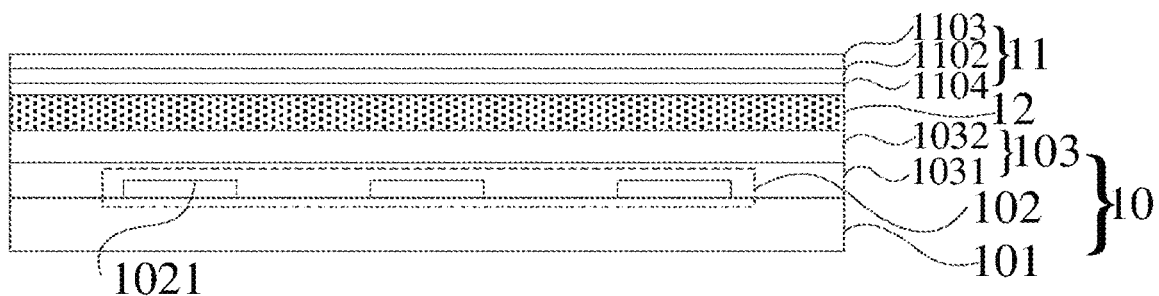
FIG. 6 is a structural diagram of a shielding film layer of another circuit board provided in an embodiment of the disclosure.

FIG. 6 is a structural diagram of the shielding film layer of another circuit board provided in an embodiment of the disclosure.

In one embodiment, as shown in FIG. 6, the shielding film layer 11 includes a conductive adhesive layer 1104, a shielding layer 1102 and an insulating layer 1103 which are sequentially stacked, wherein the shielding film layer 11 is attached to a surface of one side, away from the dielectric layer 12, of the circuit board body 10 by the conductive adhesive layer 1104.

In one embodiment, the shielding film layer 11 includes a conductive adhesive layer 1104 having an attachment function, a shielding layer 1102 attached to one side, away from the dielectric layer 12, of the conductive adhesive layer 1104, and an insulating layer 1103 attached to one side, away from the conductive adhesive layer 1104, of the shielding layer 1102. Generally, the shielding layer 1102 has a thickness in a range of 0.1 microns to 10 microns. It should be noted that, unlike the shielding film layer 11 with the second adhesive film layer 1101, the shielding layer 1102 in the shielding film layer 11 with the conductive adhesive layer 1104 does not have a protruding structure extending into the conductive adhesive layer 1104 at one side close to the conductive adhesive layer 1104. The conductive adhesive layer 1104 may be made of a conductive adhesive.

When the board is actually manufactured, there are other types of shielding film layers. The disclosure is not limited to only using several types of shielding film layers described in the above embodiments, and other types of shielding film layers may also be attached according to actual needs, and detailed description is omitted in the disclosure.

In the embodiments of the disclosure, under the situation that the dielectric layer is added, the different type of the shielding film layers are attached, the reduction effects of the insertion loss of the circuit board will be different. When the dielectric layers have different thicknesses and the different types of shielding film layers are attached, the insertion loss of the circuit board will be different. When the dielectric layers have different relative dielectric constants and the different types of shielding film layers are attached, the insertion loss of the circuit board will be different. To sum up, the relative dielectric constant, the thickness of the dielectric layer and the type of the shielding film layer all have an influence on the insertion loss of the circuit board. When the circuit board is actually designed and manufactured, different dielectric layer types and shielding film layer types may be selected according to function needs or manufacturing cost needs of the circuit board, so as to achieve the effects that the circuit board is more efficient and cost is lower.

In one embodiment, the shielding layer 1102 is provided with at least one through hole.

In the embodiments of the disclosure, the shielding layer 1102 of the shielding film layer 11 is provided with at least one through hole. When the shielding film layer 11 is attached, a high temperature may cause that volatile matter appears in the adhesive film layer, and the volatile matter is gas volatile matter, such that the shielding film layer is prone to be foamed and layered, and the shielding film layer is peeled away from other layers of the circuit board. By providing the through hole in the shielding layer 1102, the volatile matter in the adhesive film layer may be exhausted by the through hole of the shielding layer 1102 at the high temperature, such that the volatile matter in the adhesive film layer is prevented from being difficult to exhaust at the high temperature, the shielding film layer is prevented from being peeled away, and the shielding film layer is more closely attached to other layers.

In one embodiment, the shielding layer 1102 is electrically connected with the grounding wire of the circuit board body by a connecting hole.

In the embodiments of the disclosure, the plurality of transmission wires 1021 include the signal wires and grounding wires, and the shielding layer 1102 is electrically connected with the grounding wire by the connecting hole, thereby making the shielding film layer 11 grounded.

In one embodiment, the connecting hole is a through hole penetrating the covering film layer 103 and the dielectric layer 12. When the shielding film layer 11 is provided with the protruding structure on one side, close to the second adhesive film layer 1101, of the shielding layer 1102, and the second adhesive film layer 1101 is a shielding film layer of a non-conductive adhesive film layer, the second adhesive film layer 1101 flows into the connecting hole, and the shielding layer 1102 penetrates the second adhesive film layer 1101 by the protruding structure to be connected with the grounding wire, thereby making the shielding film layer 11 grounded. When the second adhesive layer 1101 is an adhesive layer (that is, the conductive adhesive) with conductive particles, the conductive adhesive flows into the connecting hole, and the shielding layer 1102 penetrates the conductive adhesive by the protruding structure and conductive particles of the conductive adhesive at the same time to be connected with the grounding wire, thereby making the shielding film layer 11 grounded. When the shielding film layer 11 includes the conductive adhesive layer 1104, the shielding layer 1102 and the insulating layer 1103 which are sequentially stacked, the conductive adhesive layer 1104 flows into the connecting hole, and the shielding layer 1102 is connected with the grounding wire by the conductive adhesive layer 1104, thereby making the shielding film layer 11 grounded.

Embodiment 2

An embodiment of the disclosure further provides an electronic device. The electronic device includes the circuit board in the above embodiments.

In the embodiment of the disclosure, the electronic device uses the circuit board with the dielectric layer, and when the circuit board transmits a high-frequency signal, an attenuation degree of the signal is reduced, so as to reduce the insertion loss of the circuit board, and achieve the technical effects that the circuit board has relatively low insertion loss and desirable signal transmission integrity when transmitting the high-frequency signal, and the circuit board is simple in manufacturing process and relatively low in manufacturing cost. Then, the electronic device has better performance and longer service life.

In the description of the embodiments of the disclosure, unless otherwise explicitly specified and defined, the terms "mounted", "mutually connected" and "connected to" should be understood in a broad sense. For example, a connection may be a fixed connection, a detachable connection, or an integrated connection, may be a mechanical connection or an electrical connection, may be a direct connection, or an indirect connection via an intermediate medium, or may be communication inside two elements. For those of ordinary skill in the art, the specific meanings of the above terms in the disclosure may be understood in accordance with specific situations.

It should be noted that what is mentioned above is merely part of embodiments of the disclosure and an applied technical principle.

What is claimed is:

1. A circuit board, comprising a circuit board body and a shielding film layer, and further comprising a dielectric layer, wherein the dielectric layer is arranged between the circuit board body and the shielding film layer,
   wherein the circuit board body comprises a substrate layer, a wiring layer arranged on at least one side of the substrate layer and a covering film layer arranged on a side, away from the substrate layer, of the wiring layer,
   wherein the covering film layer comprises a covering layer and a first adhesive film layer, wherein the covering layer is attached to a surface of a side, away from the substrate layer, of the wiring layer by the first adhesive film layer, the dielectric layer is arranged between the covering layer and the shielding film layer, and
   the covering layer and the dielectric layer are of an integrated structure.

2. The circuit board as claimed in claim 1, wherein the dielectric layer has a relative dielectric constant in a range of 1 to 10.

3. The circuit board as claimed in claim 2, wherein the dielectric layer has a relative dielectric constant in a range of 2 to 6.

4. The circuit board as claimed in claim 1, wherein the dielectric layer is made of at least one of: epoxy resin, modified epoxy resin, polyimide, modified polyimide, thermoplastic polyimide, modified thermoplastic polyimide, polyphenylene ether, acrylic acid, modified acrylic acid, olefin resin, polyetheretherketone, polystyrene, polyester, rubber, modified rubber, polyurethane and liquid crystal polymer.

5. The circuit board as claimed in claim 1, wherein the dielectric layer has a thickness in a range of 1 micron to 100 microns.

6. The circuit board as claimed in claim 5, wherein the dielectric layer has a thickness in a range of 1 micron to 50 microns.

7. The circuit board as claimed in claim 1, wherein the wiring layer comprises a plurality of transmission wires, each of the transmission wires comprising a signal wire and a grounding wire; and
   the dielectric layer is arranged on a side, away from the substrate layer, of the covering film layer.

8. The circuit board as claimed in claim 1, wherein the covering layer and the dielectric layer are made of different materials.

9. The circuit board as claimed in claim 1, wherein the shielding film layer comprises a second adhesive film layer, a shielding layer and an insulating layer which are sequentially stacked; wherein
   the shielding film layer is attached to a surface of a side, away from the circuit board body, of the dielectric layer by the second adhesive film layer; and
   a protruding structure is arranged on a side, close to the second adhesive film layer, of the shielding layer and extends into the second adhesive film layer.

10. The circuit board as claimed in claim 9, wherein the second adhesive film layer is made of a conductive adhesive.

11. The circuit board as claimed in claim 9, wherein the shielding layer is provided with at least one through hole.

12. The circuit board as claimed in claim 9, wherein the shielding layer is electrically connected with a grounding wire of the circuit board body by a connecting hole.

13. The circuit board as claimed in claim 1, wherein the shielding film layer comprises a conductive adhesive layer, a shielding layer and an insulating layer which are sequentially stacked, and the shielding film layer is attached to a surface of a side, away from the dielectric layer, of the circuit board body by the conductive adhesive layer.

14. The circuit board as claimed in claim 13, wherein the shielding layer is provided with at least one through hole.

15. The circuit board as claimed in claim 13, wherein the shielding layer is electrically connected with a grounding wire of the circuit board body by a connecting hole.

16. An electronic device, comprising the circuit board as claimed in claim 1.

17. The electronic device as claimed in claim 16, wherein the dielectric layer has a relative dielectric constant in a range of 2 to 6.

18. The electronic device as claimed in claim 16, wherein the dielectric layer has a thickness in a range of 1 micron to 50 microns.

19. The electronic device as claimed in claim 16, wherein the wiring layer comprises a plurality of transmission wires, each of the transmission wires comprising a signal wire and a grounding wire; and
   the dielectric layer is arranged on a side, away from the substrate layer, of the covering film layer.

* * * * *